(12) United States Patent
Kubota et al.

(10) Patent No.: US 9,184,116 B2
(45) Date of Patent: Nov. 10, 2015

(54) METHOD OF MANUFACTURING RESIN-ENCAPSULATED SEMICONDUCTOR DEVICE, AND LEAD FRAME

(71) Applicant: SEIKO INSTRUMENTS INC., Chiba (JP)

(72) Inventors: Shinya Kubota, Chiba (JP); Masaru Akino, Chiba (JP)

(73) Assignee: SEIKO INSTRUMENTS INC. (JP)

(*) Notice: Subject to any disclaimer, the term of this patent is extended or adjusted under 35 U.S.C. 154(b) by 0 days.

(21) Appl. No.: 14/174,722

(22) Filed: Feb. 6, 2014

(65) Prior Publication Data

US 2014/0224534 A1 Aug. 14, 2014

(30) Foreign Application Priority Data

Feb. 13, 2013 (JP) .................. 2013-025966

(51) Int. Cl.
*H01L 21/00* (2006.01)
*H01L 23/495* (2006.01)
*H01L 23/31* (2006.01)
*H01L 23/00* (2006.01)

(52) U.S. Cl.
CPC ...... *H01L 23/49503* (2013.01); *H01L 23/3107* (2013.01); *H01L 23/49541* (2013.01); *H01L 23/49548* (2013.01); *H01L 23/49582* (2013.01); *H01L 24/29* (2013.01); *H01L 24/32* (2013.01); *H01L 24/48* (2013.01); *H01L 24/73* (2013.01); *H01L 24/85* (2013.01); *H01L 2224/2919* (2013.01); *H01L 2224/32245* (2013.01); *H01L 2224/451* (2013.01); *H01L 2224/48091* (2013.01); *H01L 2224/48247* (2013.01); *H01L 2224/73265* (2013.01); *H01L 2224/83439* (2013.01); *H01L 2224/85439* (2013.01)

(58) Field of Classification Search
USPC .......................... 257/666, 677; 438/111, 123
See application file for complete search history.

(56) References Cited

U.S. PATENT DOCUMENTS

| | | | | |
|---|---|---|---|---|
| 6,034,422 A | * | 3/2000 | Horita et al. | 257/677 |
| 6,518,653 B1 | * | 2/2003 | Takagi | 257/677 |
| 6,593,643 B1 | * | 7/2003 | Seki et al. | 257/677 |
| 6,646,330 B2 | * | 11/2003 | Kubara et al. | 257/677 |
| 8,581,379 B2 | * | 11/2013 | Kure et al. | 257/676 |
| 2007/0243665 A1 | * | 10/2007 | Abbott et al. | 438/123 |

OTHER PUBLICATIONS

Patent Abstracts of Japan, Publication No. 11-260982, Publication Date Sep. 24, 1999.

* cited by examiner

*Primary Examiner* — S. V. Clark
(74) *Attorney, Agent, or Firm* — Adams & Wilks (57) ABSTRACT

A method of manufacturing a resin-encapsulated semiconductor device capable of supporting finer pitches comprises forming a metal plating layer on an inner lead and an outer lead of a lead. A semiconductor chip is mounted on a die pad, and an electrode on a surface of the semiconductor chip is electrically connected to the inner lead via a thin metal wire. The semiconductor chip, the thin metal wire and the inner lead are encapsulated by an encapsulation resin so that the outer lead extends beyond the encapsulation resin and is exposed. Resin burrs formed during resin encapsulation are removed by a defocused laser, and any metal adhered on the lead is lifted off.

7 Claims, 10 Drawing Sheets

PRIOR ART

FIG. 7

PRIOR ART

METHOD OF MANUFACTURING RESIN-ENCAPSULATED SEMICONDUCTOR DEVICE, AND LEAD FRAME

BACKGROUND OF THE INVENTION

1. Field of the Invention

The present invention relates to a method of manufacturing a resin-encapsulated semiconductor device, and a lead frame. In particular, the present invention relates to a method of removing a resin burr of a resin-encapsulated semiconductor device and a metal adhered thereto.

2. Description of the Related Art

In recent years, in order to respond to miniaturization of electronic equipment, high-density mounting of electronic devices to be loaded in the electronic equipment has been demanded. The electronic devices include a resin-encapsulated device in which a chip having an element such as a transistor mounted thereon is encapsulated in an encapsulation resin together with a wiring member such as a lead. Also the resin-encapsulated device is becoming miniaturized and thinned. Along therewith, the pitch of the leads in the resin-encapsulated device is becoming reduced, and a method of mounting the electronic devices tends to be diversified as exemplified by the appearance of leadless devices. To deal with this, a novel manufacturing method involving the mounting of electronic devices has been sought after.

The structure of a related-art encapsulated semiconductor device and a manufacturing method therefor are described below.

Figure 6:
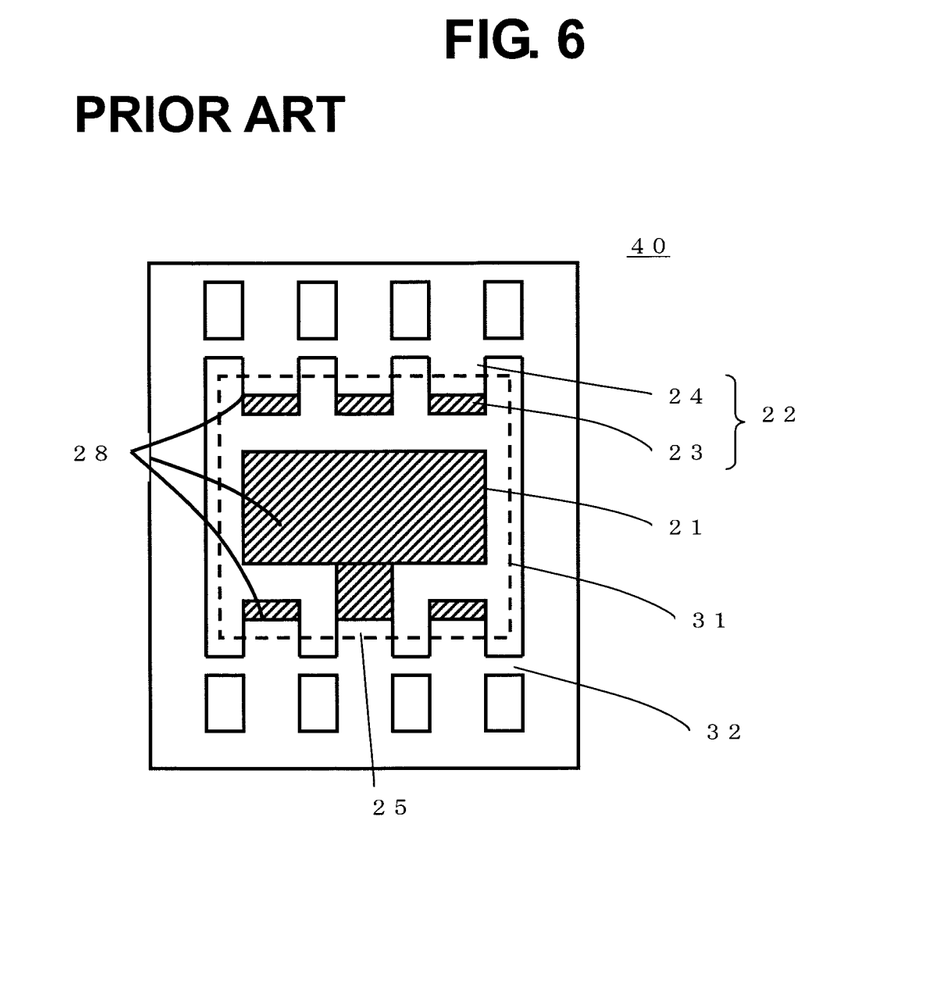
FIG. 6 is a plan view of a lead frame to be used for manufacturing a related-art resin-encapsulated semiconductor device.

FIG. 6 is a plan view of a lead frame to be used for manufacturing a related-art resin-encapsulated semiconductor device. A related-art lead frame 40 includes a quadrangular outer frame, a quadrangular die pad 21 for mounting a semiconductor chip thereon, a suspension lead 25 for connecting the outer frame and the die pad 21 to each other, an inner lead 23, and an outer lead 24. The die pad 21 is provided substantially at a center part of a region surrounded by the outer frame. The inner lead 23 is electrically connected to the semiconductor chip via connection means such as a thin metal wire in the state in which the semiconductor chip is mounted. The outer lead 24 is provided continuously to the inner lead 23 and is used for connection to an external terminal. A plurality of leads 22 are coupled to one another via a tie bar 32. A metal plating layer 28 made of silver or the like is selectively coated on the die pad 21 and the inner lead 23 of the lead 22. Further, a part surrounded by the dotted line is a region to be encapsulated by an encapsulation resin 31. Note that, the lead frame 40 does not have only one independent pattern formed of the structure illustrated in FIG. 6, but has a plurality of patterns arranged continuously in the horizontal and vertical directions of FIG. 6 for high volume manufacturing.

Figure 7:
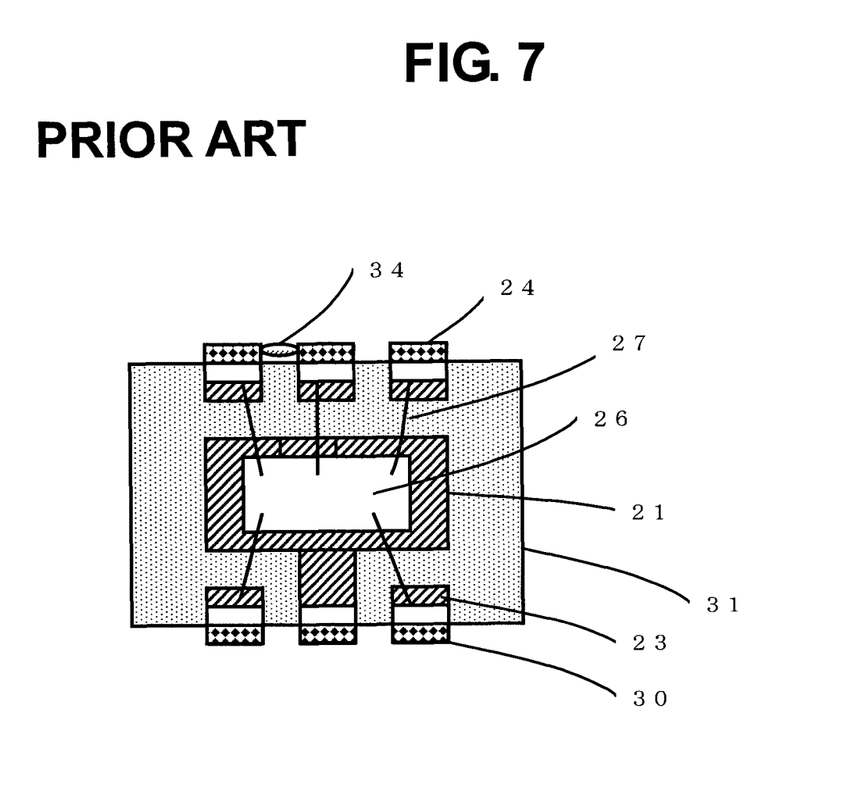
FIG. 7 is a perspective plan view of the related-art resin-encapsulated semiconductor device.

FIG. 7 is a perspective plan view of the related-art resin-encapsulated semiconductor device. A semiconductor chip 26 is mounted on the die pad 21 of the lead frame 40 illustrated in FIG. 6. Electrodes (not shown) on a surface of the semiconductor chip 26 are connected to the inner leads 23 via thin metal wires 27. The semiconductor chip 26, the thin metal wires 27, and the like are encapsulated by the encapsulation resin 31 so that the outer leads 24 may be exposed. In FIG. 7, the encapsulation resin 31 is transparent. An adhered metal 34 is present between the outer leads 24, which is a part of metal that is scattered when the lead frame is heated and melted with the use of a laser for removing the tie bar 32 and removing a resin protruding in resin encapsulation. Such an adhered metal is highly responsible for an electrical characteristics failure. To avoid this, the following method has been proposed. In a laser cutting step, a tape material is brought into close contact with a cutting portion so that a part of melted metal may be transferred onto the tape material, thereby preventing the melted metal from adhering on a product region (see, for example, Japanese Published Patent Application H11-260982).

The above-mentioned manufacturing method, however, has a concern about an increase in manufacturing cost because of the additional step of attaching and removing the tape member.

SUMMARY OF THE INVENTION

It is an object of the present invention to solve, replacing the above-mentioned manufacturing method, the above-mentioned problem that, when a processed portion is irradiated with a laser, a part of heated and melted metal is liable to adhere on another portion.

In order to achieve the above-mentioned object, the present invention employs the following measures.

First, according to one embodiment of the present invention, there is employed a method of manufacturing a resin-encapsulated semiconductor device including a lead frame including a die pad and a plurality of leads, a semiconductor chip, and an encapsulation resin, the method including: forming a metal plating layer on surfaces of an inner lead and an outer lead of the lead frame; mounting the semiconductor chip on the die pad; connecting the semiconductor chip and the inner lead via a thin metal wire; exposing the outer lead by resin-encapsulating the semiconductor chip mounted on the die pad, the thin metal wire, and the plurality of leads; removing a resin burr formed between adjacent ones of the outer leads by laser irradiation; removing the metal plating layer exposed from the encapsulation resin; and forming a solder plating layer on the outer lead.

Further, in the method of manufacturing a resin-encapsulated semiconductor device employed herein, the removing of the resin burr includes defocusing a laser from each of the plurality of leads.

Further, the method of manufacturing a resin-encapsulated semiconductor device employed herein further includes performing light etching in the forming of the metal plating layer.

Further, in the method of manufacturing a resin-encapsulated semiconductor device employed herein, the forming of the metal plating layer on the surfaces of the inner lead and the outer lead of each of the plurality of leads includes coating only a top surface of the each of the plurality of leads with the metal plating layer.

Further, in the method of manufacturing a resin-encapsulated semiconductor device employed herein, the forming of the metal plating layer on the surfaces of the inner lead and the outer lead of each of the plurality of leads includes coating a top surface and a side surface of the each of the plurality of leads with the metal plating layer.

Further, in the method of manufacturing a resin-encapsulated semiconductor device employed herein, the forming of the metal plating layer on the surfaces of the inner lead and the outer lead of each of the plurality of leads includes coating a top surface, a side surface, and a bottom surface of the each of the plurality of leads with the metal plating layer.

Further, in the method of manufacturing a resin-encapsulated semiconductor device employed herein, the forming of the metal plating layer on the surfaces of the inner lead and the outer lead of each of the plurality of leads includes forming metal plating layers on the surface of the inner lead and the surface of the outer lead so that the metal plating layers are spaced apart from each other.

Further, according to one embodiment of the present invention, there is provided a lead frame, including: a die pad; a plurality of leads; and metal plating layers formed on at least a surface of an inner lead and a surface of an outer lead of each of the plurality of leads.

Further, in the lead frame, the metal plating layer is coated only on a top surface of each of the plurality of leads.

Further, in the lead frame, the metal plating layer is coated on a top surface and a side surface of each of the plurality of leads.

Further, in the lead frame, the metal plating layer is coated on a top surface, a side surface, and a bottom surface of each of the plurality of leads.

Further, in the lead frame, the metal plating layer formed on the surface of the inner lead and the metal plating layer formed on the surface of the outer lead are spaced apart from each other.

DETAILED DESCRIPTION OF THE INVENTION

A method of manufacturing a resin-encapsulated device according to a first embodiment of the present invention is described below with reference to the accompanying drawings.

Figure 1:
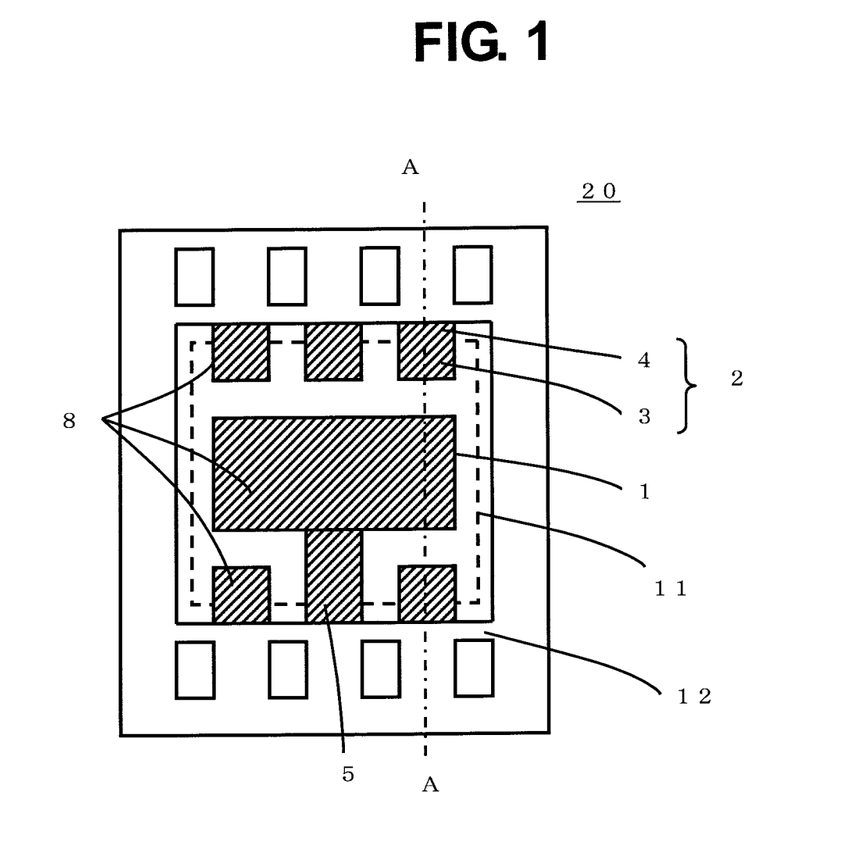
FIG. 1 is a plan view of a lead frame to be used for manufacturing a resin-encapsulated semiconductor device according to a first embodiment of the present invention.

FIG. 1 is a plan view of a lead frame to be used for manufacturing a resin-encapsulated semiconductor device according to the first embodiment of the present invention. A lead frame 20 includes a quadrangular outer frame, a quadrangular die pad 1 for mounting a semiconductor chip thereon, a suspension lead 5 for connecting the outer frame and the die pad 1 to each other, an inner lead 3, and an outer lead 4. The die pad 1 is provided substantially at a center part of a region surrounded by the outer frame. The inner lead 3 is electrically connected to the semiconductor chip via connection means such as a thin metal wire in the state in which the semiconductor chip is mounted. The outer lead 4 is provided continuously to the inner lead 3 and is used for connection to an external terminal. A plurality of leads 2 are coupled to one another via a tie bar 12. A metal plating layer 8 made of silver or the like is coated on an entire region of the die pad 1 and an, entire region of the leads 2, that is, on a region from the inner lead 3 to the outer lead 4 continuously up to the vicinity of the tie bar 12. In this case, the metal plating layer 8 may reach the tie bar 12. Further, a part surrounded by the dotted line is a region to be encapsulated by an encapsulation resin 11. Note that, the lead frame 20 does not have one pattern formed of the structure illustrated in FIG. 1, but has a plurality of patterns arranged continuously in the horizontal and vertical directions.

FIGS. 2A to 2F are cross-sectional views illustrating the steps of manufacturing the resin-encapsulated semiconductor device according to the first embodiment of the present invention, illustrating the cross-sections taken along the line A-A of FIG. 1.

Figure 2A:
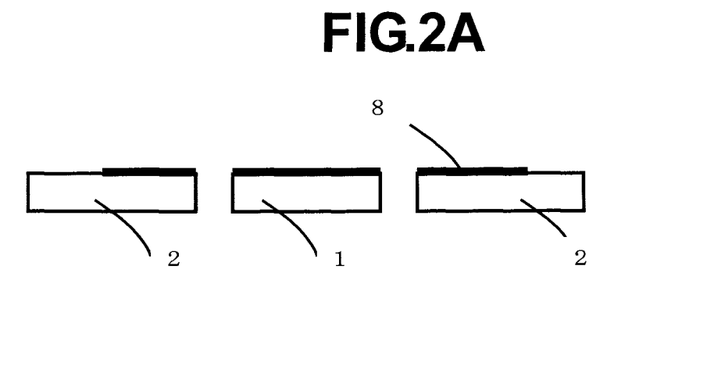
FIGS. 2A to 2F are cross-sectional views illustrating steps of manufacturing the resin-encapsulated semiconductor device according to the first embodiment of the present invention.

FIG. 2A is a cross-sectional view of the lead frame to be used for manufacturing the resin-encapsulated semiconductor device according to the first embodiment of the present invention. The die pad 1 and the leads 2 are arranged to be spaced apart from each other, and the surfaces of the die pad 1 and the leads 2 are coated with the metal plating layer 8.

Figure 2B:
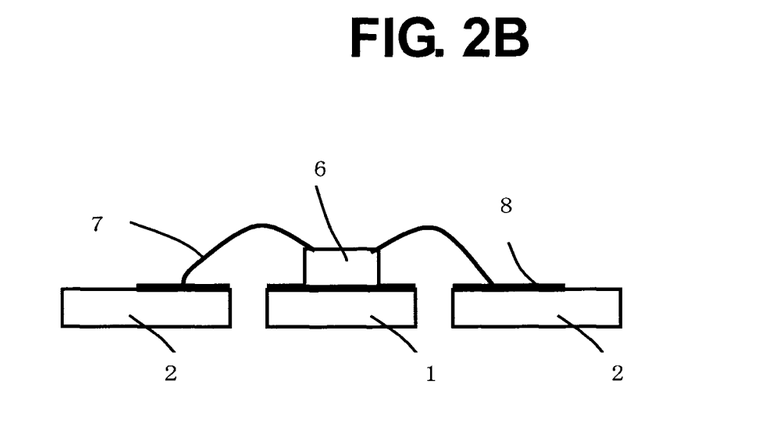

In FIG. 2B, a semiconductor chip 6 is mounted on the surface of the die pad 1 via an adhesive (not shown), and electrodes (not shown) on the surface of the semiconductor chip 6 are electrically connected to the leads 2 by using thin metal wires 7.

Figure 2C:
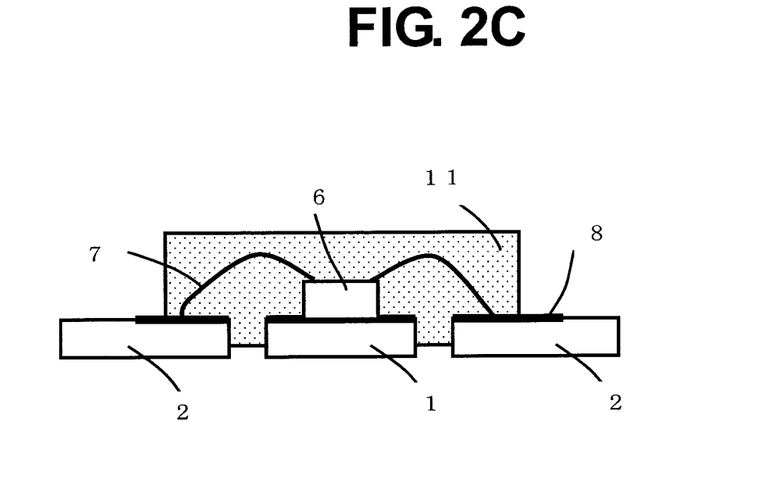

FIG. 2C is a cross-sectional view after the step of encapsulating the semiconductor chip 6 mounted on the die pad 1 and the thin metal wires 7 connected to the leads 2 by the encapsulation resin 11. The bottom surface of the die pad 1 and a part of the leads 2 are exposed from the encapsulation resin 11. Further, a part of the metal plating layer 8 formed on the leads is also exposed from the encapsulation resin 11. In the related-art resin-encapsulated semiconductor device, the metal plating layer is completely encapsulated by the encapsulation resin, but in the present invention, the region of the metal plating layer is wider than that in the related-art resin-encapsulated semiconductor device, and the metal plating layer 8 protrudes from the encapsulation resin.

Figure 2D:
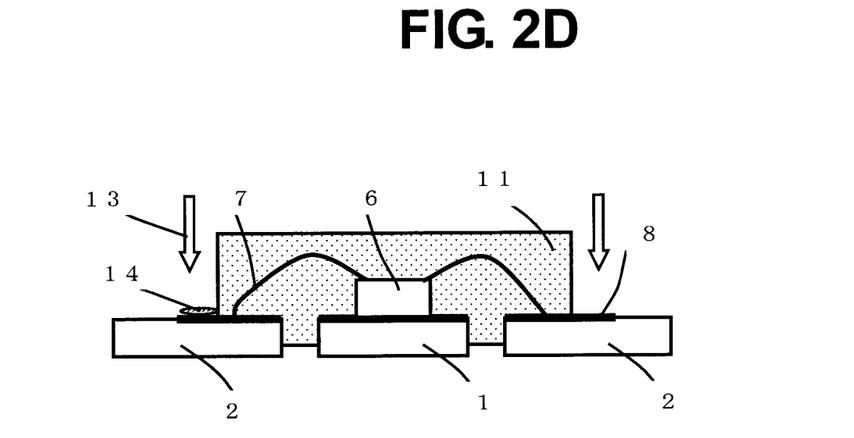

FIG. 2D is a cross-sectional view illustrating the step of removing, by laser irradiation 13, a resin burr that protrudes from a gap between an upper mold and a lower mold and is formed between adjacent outer leads in the resin encapsulation step. A laser is defocused so as not to focus on the lead 2. It is desired that the laser focus on a position higher than the top surface of the lead. This configuration prevents the concentration of laser energy on one point, and hence a wide area is irradiated with a laser having an attenuated energy density. Thus, the laser irradiation 13 enables efficient removal of a resin burr and prevents a part of the lead frame from melting and scattering. A slight amount of an adhered metal 14 scattered at this time adheres onto the metal plating layer 8. If the resin burr is not completely removed, alkaline treatment, water jet treatment, or the like is added after the laser irradiation to completely remove the resin burr.

Figure 2E:
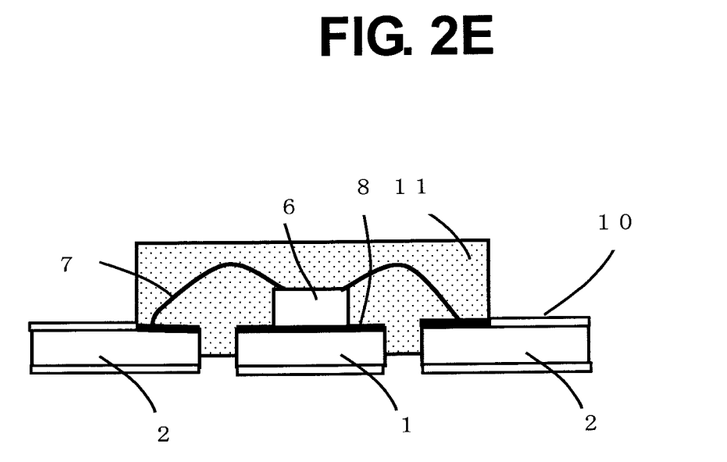

FIG. 2E is a cross-sectional view after the adhered metal on the metal plating layer 8 generated in the previous step is removed and a solder plating layer 10 is newly formed by coating. The encapsulation resin 11 serves as a mask, and the metal plating layer 8 exposed from the encapsulation resin 11 on the lead is completely removed. At this time, the adhered metal is lifted off from the lead. Note that, the metal removal step includes a plating-layer removal step for etching the metal plating layer and a light etching step. A slight amount of residue that has failed to be lifted off in the plating-layer removal step is removed in the subsequent light etching step. Note that, in the case where the metal plating layer is a silver plating layer, a ferric nitrate solution or Top Rip (manufactured by OKUNO CHEMICAL INDUSTRIES CO., LTD.) is used in the plating-layer removal step, and in the case where the frame is made of copper, a ferric chloride solution or Melpolish (manufactured by Meltex Inc.) is used in the light etching step. In the step of forming the solder plating layer, a coating film having a main component of tin and added with bismuth or silver is formed.

Figure 2F:
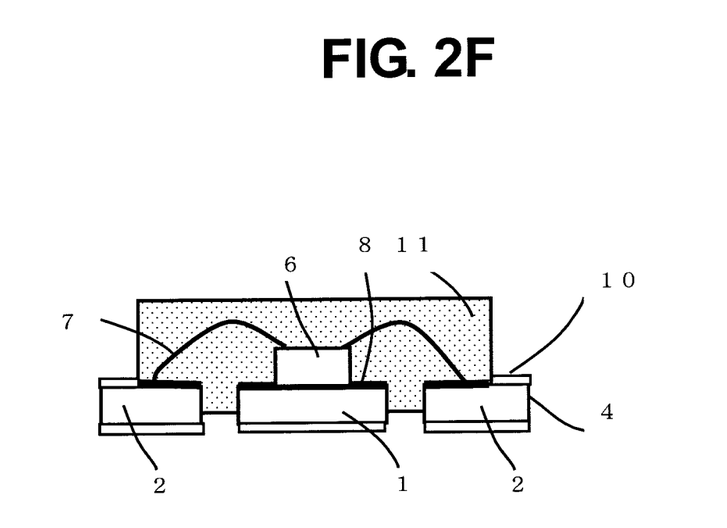

FIG. 2F is a cross-sectional view illustrating a state in which the outer frame of the lead frame including the tie bar is cut to separate the resin-encapsulated semiconductor device from the outer frame of the lead frame. As illustrated in FIG. 2F, the solder plating layer 10 is coated on the bottom surface of the lead 2 and the top surface of the outer lead 4, but is not coated on a side edge surface of the outer lead 4, which is a cut surface after singulation.

Figure 3:
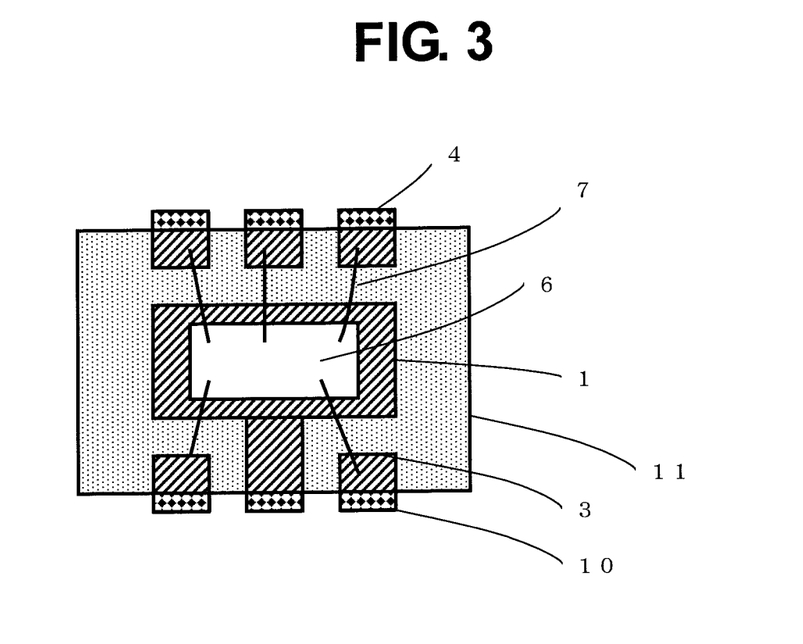
FIG. 3 is a perspective plan view of the resin-encapsulated semiconductor device according to the first embodiment of the present invention.

FIG. 3 is a perspective plan view of the resin-encapsulated semiconductor device according to the first embodiment of the present invention.

The semiconductor chip 6 is mounted on the die pad 1. The electrodes (not shown) on the surface of the semiconductor chip 6 are connected to the inner leads 3 via the thin metal wires 7. The semiconductor chip 6, the thin metal wires 7, and the like are encapsulated by the encapsulation resin 11 so that the outer leads 4 may be exposed. The top surfaces of the outer leads 4 are coated with the solder plating layer 10.

Through the steps described above, the resin-encapsulated semiconductor device according to the present invention, which solves the problem that, when a processed portion is irradiated with a laser, a part of heated and melted metal is liable to adhere on another portion, is completed.

Figure 4:
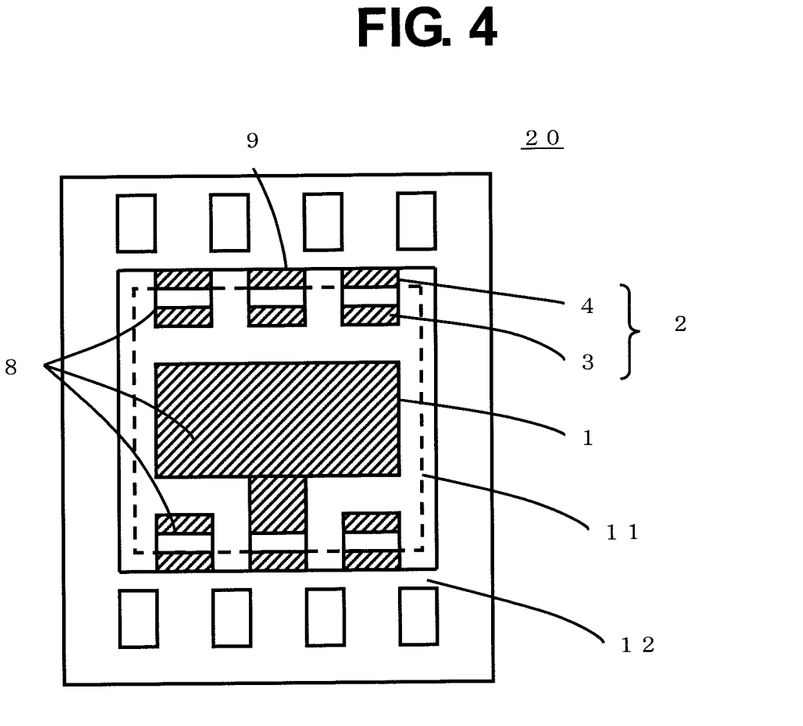
FIG. 4 is a plan view of a lead frame to be used for manufacturing a resin-encapsulated semiconductor device according to a second embodiment of the present invention.

FIG. 4 is a plan view of a lead frame to be used for manufacturing a resin-encapsulated semiconductor device according to a second embodiment of the present invention. The difference from the lead frame illustrated in FIG. 1 resides in a metal plating layer formed on the top surface of the lead. In this embodiment, a first metal plating layer 8 formed on the inner lead and a second metal plating layer 9 formed on the outer lead are arranged to be spaced apart from each other. The use of this type of lead frame prevents the metal plating layer from being exposed from the edge of the encapsulation resin, thus obtaining a resin-encapsulated semiconductor device with good reliability.

Figure 5:
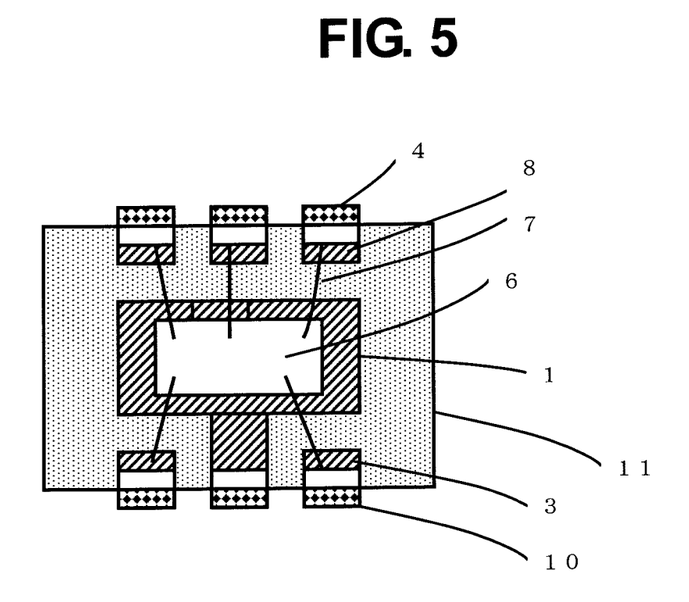
FIG. 5 is a perspective plan view of the resin-encapsulated semiconductor device according to the second embodiment of the present invention.

FIG. 5 is a perspective plan view of the resin-encapsulated semiconductor device according to the second embodiment of the present invention.

The semiconductor chip 6 is mounted on the die pad 1. The electrodes (not shown) on the surface of the semiconductor chip 6 are connected to the inner leads 3 via the thin metal wires 7. The semiconductor chip 6, the thin metal wires 7, and the like are encapsulated by the encapsulation resin 11 so that the outer leads 4 may be exposed. The top surface of the outer lead 4 is coated with the solder plating layer 10. The first metal plating layer 8 formed on the inner lead 3 and the solder plating layer 10 formed on the outer lead 4 are spaced apart from each other. The first metal plating layer 8 is completely encapsulated by the encapsulation resin 11 and is prevented from being exposed from the edge surface of the encapsulation resin. Consequently, the reliability is improved.

A description has been given of the embodiment in which the top surface of the lead is coated with the metal plating layer. Alternatively, however, the metal plating layer may be coated not only on the top surface but also on the side surface of the lead, or may be further coated on the bottom surface of the lead. In this manner, an adhered metal can be removed more reliably.

Figure 8A:
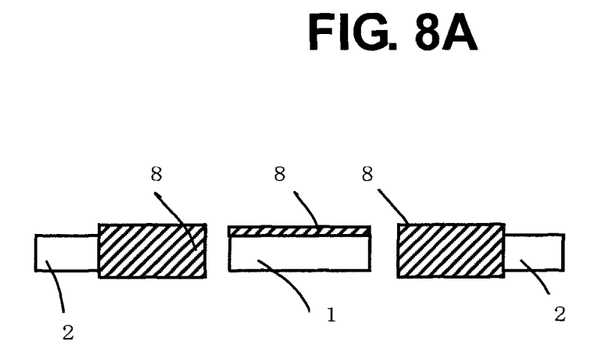
FIGS. 8A and 8B are cross-sectional views of a lead frame to be used for manufacturing a resin-encapsulated semiconductor device according to a third embodiment of the present invention.
Figure 8B:
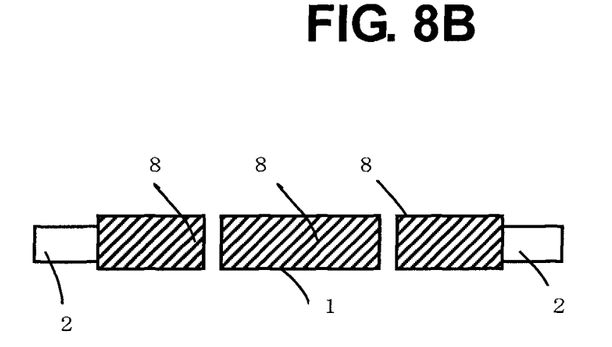

FIGS. 8A and 8B are cross-sectional views of a lead frame to be used for manufacturing a resin-encapsulated semiconductor device according to a third embodiment of the present invention. A metal plating layer 8 is coated not only on the top surface of the lead but also on the side and bottom surfaces of the lead 2. In FIG. 8A, only the top surface of the die pad 1 is coated with the metal plating layer 8. In FIG. 8B, the metal plating layer 8 is provided also on the side and bottom surfaces similarly to the lead 2.

Figure 9A:
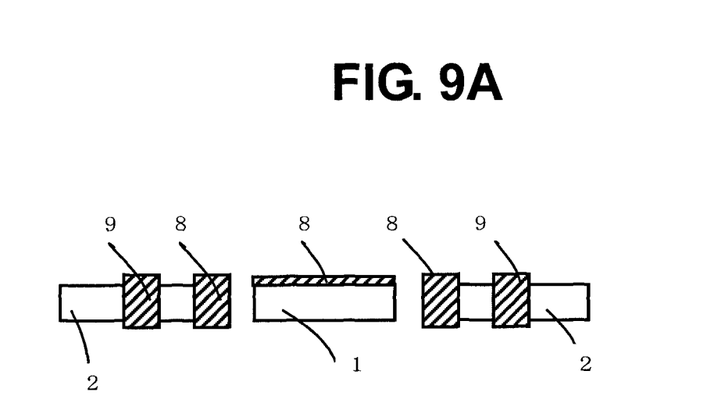
FIGS. 9A and 9B are cross-sectional views of a lead frame to be used for manufacturing a resin-encapsulated semiconductor device according to a fourth embodiment of the present invention.
Figure 9B:
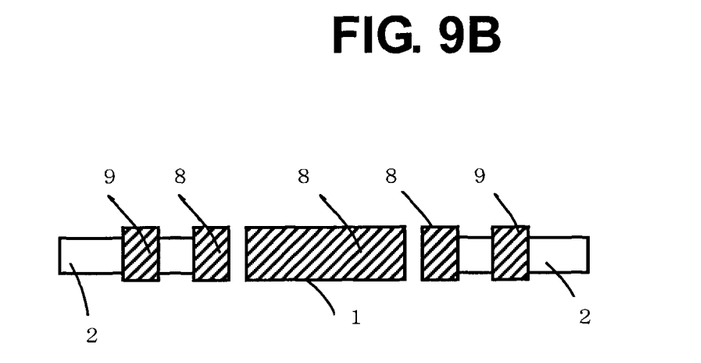

FIGS. 9A and 9B are cross-sectional views of a lead frame to be used for manufacturing a resin-encapsulated semiconductor device according to a fourth embodiment of the present invention, which is a modification example of the second embodiment. A metal plating layer 8 is coated not only on the top surface of the lead but also on the side and bottom surfaces of the lead 2. In FIG. 9A, the first metal plating layer 8 and the second metal plating layer 9 are arranged only on the top surface of the die pad 1 so as to be spaced apart from each other. In FIG. 9B, the metal plating layer 8 is provided also on the side and bottom surfaces similarly to the lead 2.

What is claimed is:
1. A method of manufacturing a resin-encapsulated semiconductor device, comprising:
  preparing a lead frame comprising a plurality of leads and a die pad, the plurality of leads each comprising an inner lead and an outer lead;
  forming a metal plating layer on a surface of the die pad and surfaces of the inner lead and the outer lead of each of the plurality of leads;
  mounting a semiconductor chip on the die pad having the metal plating layer formed thereon;
  connecting the semiconductor chip and the inner lead via a thin metal wire;
  exposing the outer lead by resin-encapsulating the semiconductor chip mounted on the die pad, the thin metal wire, and the inner lead with an encapsulation resin;
  removing a resin burr formed between adjacent ones of the outer leads by laser irradiation;
  removing the metal plating layer exposed from the encapsulation resin; and
  forming a solder plating layer on the outer lead from which the metal plating layer is removed.

2. A method of manufacturing a resin-encapsulated semiconductor device according to claim 1, wherein the removing of the resin burr comprises defocusing a laser from each of the plurality of leads.

3. A method of manufacturing a resin-encapsulated semiconductor device according to claim 1, further comprising performing light etching in the removing of the metal plating layer.

4. A method of manufacturing a resin-encapsulated semiconductor device according to claim 1, wherein the forming of the metal plating layer on the surfaces of the inner lead and the outer lead comprises coating only a top surface of each of the plurality of leads with the metal plating layer.

5. A method of manufacturing a resin-encapsulated semiconductor device according to claim 1, wherein the forming of the metal plating layer on the surfaces of the inner lead and the outer lead comprises coating a top surface and a side surface of each of the plurality of leads with the metal plating layer.

6. A method of manufacturing a resin-encapsulated semiconductor device according to claim 1, wherein the forming of the metal plating layer on the surfaces of the inner lead and the outer lead comprises coating a top surface, a side surface, and a bottom surface of each of the plurality of leads with the metal plating layer.

7. A method of manufacturing a resin-encapsulated semiconductor device according to claim 1, wherein the forming of the metal plating layer on the surfaces of the inner lead and the outer lead comprises forming metal plating layers on the surface of the inner lead and the surface of the outer lead so that the metal plating layers are spaced apart from each other.

* * * * *